United States Patent [19]

Arnett et al.

[11] Patent Number: 5,735,708
[45] Date of Patent: Apr. 7, 1998

[54] APPARATUS AND METHOD FOR DISPLAYING INFORMATION AT A WALL FACE PLATE

[75] Inventors: Jaime Ray Arnett, Fishers; David Louis Reed, New Palestine, both of Ind.

[73] Assignee: Lucent Technologies Inc., Murray Hill, N.J.

[21] Appl. No.: 644,637

[22] Filed: Apr. 3, 1996

[51] Int. Cl.$^6$ ...................................................... H05K 5/03
[52] U.S. Cl. ............................ 439/491; 174/66; D8/353
[58] Field of Search ............................ 439/491; 174/66; 220/241; 200/297, 308, 309; D8/350, 353

[56] References Cited

U.S. PATENT DOCUMENTS

| | | | |
|---|---|---|---|
| D. 366,205 | 1/1996 | Arnett | D8/353 |
| 1,930,610 | 10/1933 | Despard | 174/66 |
| 5,212,899 | 5/1993 | Fandreyer | 174/66 |
| 5,362,254 | 11/1994 | Siemon et al. | 439/491 |
| 5,613,874 | 3/1997 | Orlando et al. | 439/491 |

Primary Examiner—Neil Abrams

[57] ABSTRACT

An apparatus, preferably plastic, is configured to be attached to a wall face plate, for example, a face plate for a telephone jack, an electrical power outlet, coaxial jack, fiber optic port, etc., and is configured to display information, such as an identification or extension number. The information display apparatus has a housing with a display face that receives and supports an information panel for displaying the information. A transparent cover is placed over the information panel. The display face can be angled to permit viewing of the information at a vantage point above the wall face plate. The apparatus is attached to the exterior face of the wall face plate by attaching the housing to a screw shaft associated with a face plate screw or by adhering the rear side of the apparatus to the face plate with an adhesive material, including for example, an adhesive foam tape.

24 Claims, 6 Drawing Sheets

APPARATUS AND METHOD FOR DISPLAYING INFORMATION AT A WALL FACE PLATE

FIELD OF THE INVENTION

The present invention generally relates to the fields of labeling and identification of wall outlets, and more particularly, to an information display apparatus and method for displaying an identification or other information at a wall face plate.

BACKGROUND OF THE INVENTION

In the past, in order to identify a particular telephone jack or extension at a wall face plate, the wall face plate has been written on with an ink marker to indicate desired information, such as an extension number. Sometimes, a piece of tape that can be written on has been applied to the outside of the face plate and the information has been written on the tape. In general, these procedures work. However, the ink eventually fades and the tape can undesirably peel from the face plate.

Another prior art embodiment for labeling wall outlets for telephone jacks involves manufacturing the face plate to include a rectangular cavity for receiving a flat rectangular identification panel, typically a paperboard element. After the identification panel is placed within the cavity, a transparent cover is placed over the identification panel to hold the identification panel in the wall face plate. Opposing ends of the cover plate are typically stepped and the cover plate is flexible so that the cover plate can be flexed, inserted within the cavity, and then deflexed to secure the cover plate to the wall face plate. In order to remove the identification panel and the cover, an edge of the cover is pulled outwardly with a fingernail or utensil, such as a screwdriver, pencil, etc.

Although this embodiment has some merit, it is costly to modify existing tooling for typical wall face plates so that the tooling can produce the identification panel cavity and surrounding features for receiving the identification panel and cover. Furthermore, it is difficult to read the identification panel from a vantage point above the wall face plate.

SUMMARY OF THE INVENTION

An object of the present invention is to overcome the deficiencies and inadequacies of the prior art as noted above in the background section.

Briefly described, the present invention is an information display apparatus and method for displaying information, such as identification or extension number, at a wall face plate. The wall face plate can be, for example but not limited to, a face plate for a telephone jack, for an electrical power outlet, for a coaxial cable jack, for a fiber optic port, etc. The information display apparatus has a housing with a display face that receives and supports an information panel for displaying the information. A transparent cover is placed over the information panel. Moreover, the housing is attached to the exterior face of the wall face plate either by attaching the housing to a screw shaft associated with a face plate screw or by adhering the rear side of the housing to the face plate with an adhesive material, including for example, an adhesive tape.

In the preferred embodiment of the information display apparatus, the housing comprises a rear side that is placed contiguous with the exterior face of the wall face plate when the apparatus is attached to the face plate, opposing left and right sides disposed adjacent to the rear side, an open bottom side adjacent to the rear, left, and right sides, and the display face, which is disposed adjacent to the bottom, left, and right sides and which is angled to expose the information outwardly and upwardly when the housing is attached to the face plate. The housing can be configured in this shape using any suitable material, preferably, plastic.

The rear side preferably includes an aperture that is sized to receive a screw shaft associated with the face plate screw and that extends from an edge of the rear side to an internal region to permit ingress and egress of the screw shaft therethrough without having to remove the face plate screw. In addition, an internal information panel support extends parallel to the angled display face and between the right and left sides. This internal information panel support includes an opening substantially aligned with the aperture and sized to receive a working end of a screwdriver. Hence, the aperture can easily be placed about the screw shaft and then the screw can be tightened with an appropriate screwdriver through the openings situated in the internal information panel support.

The invention can also be viewed as providing a method for displaying information at a wall face plate. In this regard, the method can be broadly viewed as the following steps: attaching a housing to an exterior face of a wall face plate and maintaining an information panel on the housing so that the information panel is externally visible.

The invention has numerous advantages, a few of which are delineated hereafter, as mere examples.

An advantage of the information display apparatus is that it is easily and inexpensively manufactured in mass numbers with conventional industry standard processes. As an example, the apparatus can be manufactured with a conventional injection molding process.

Another advantage of the information display apparatus is that it does not require modification to existing face plate production facilities. It avoids having to modify many multiple cavity tools.

Another advantage of the information display apparatus is that it allows customer needs to be met much quicker.

Another advantage of the information display apparatus is that it permits easy viewing of the information from a vantage point above the face plate.

Another advantage of the information display apparatus is that it can be used for any type of wall face plate, including those used for telephone jacks, electrical power outlets, coaxial cables, fiber optic ports, etc.

Another advantage of the information display apparatus is that it is simple in design and aesthetically pleasing.

Another advantage of the information display apparatus is that it permits retrofitting of a device for displaying information directly to an existing wall face plate.

Other objects, features, and advantages of the present invention will become apparent to one of skill in the art upon examination of the following drawings and the associated detailed description.

BRIEF DESCRIPTION OF THE DRAWINGS

The present invention can be better understood with reference to the following drawings. The drawings are not necessarily to scale, emphasis instead being placed upon clearly illustrating principles of the present invention. Furthermore, like reference numerals designate corresponding throughout the several views.

3

Figure 1:
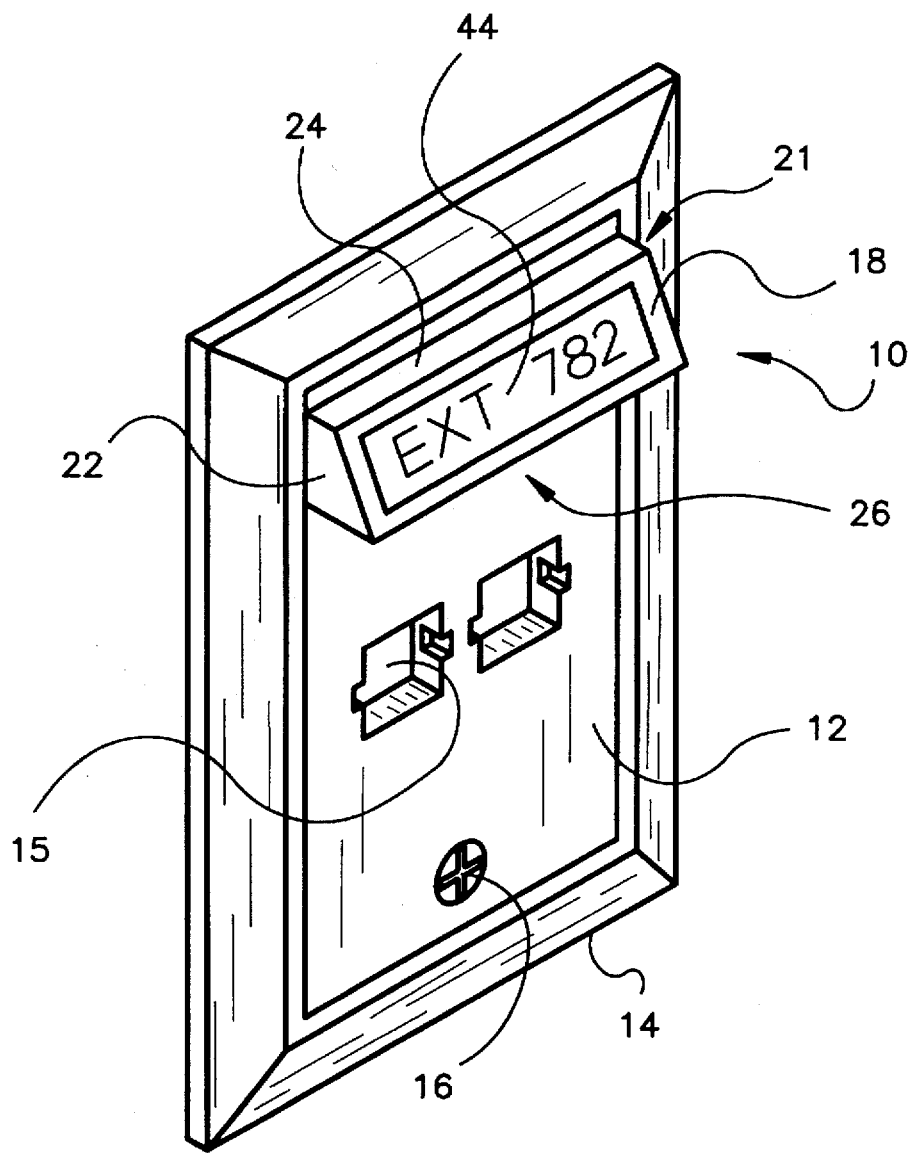
FIG. 1 is a first embodiment of the information display apparatus of the invention.
Figure 2:
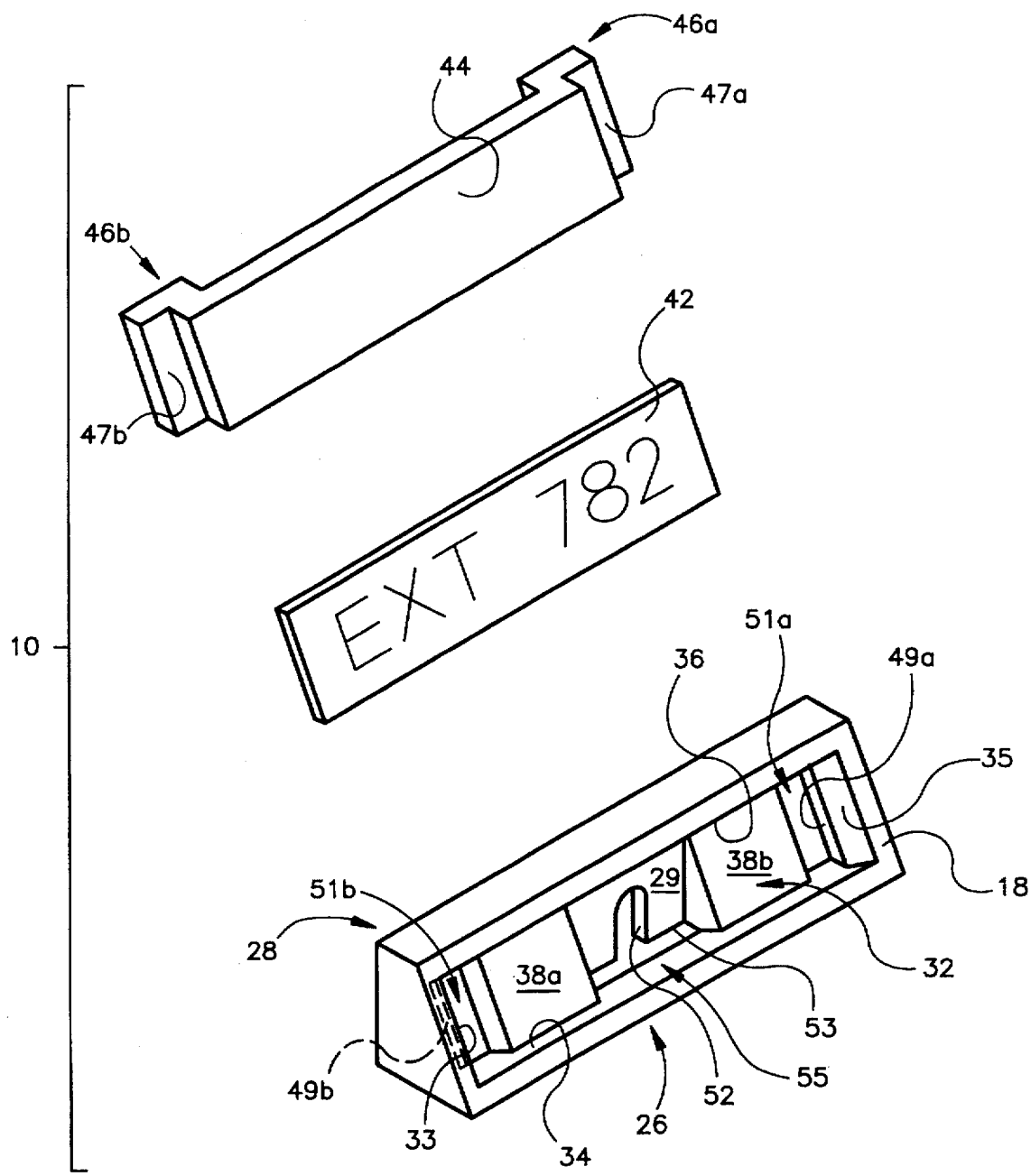
Figure 3:
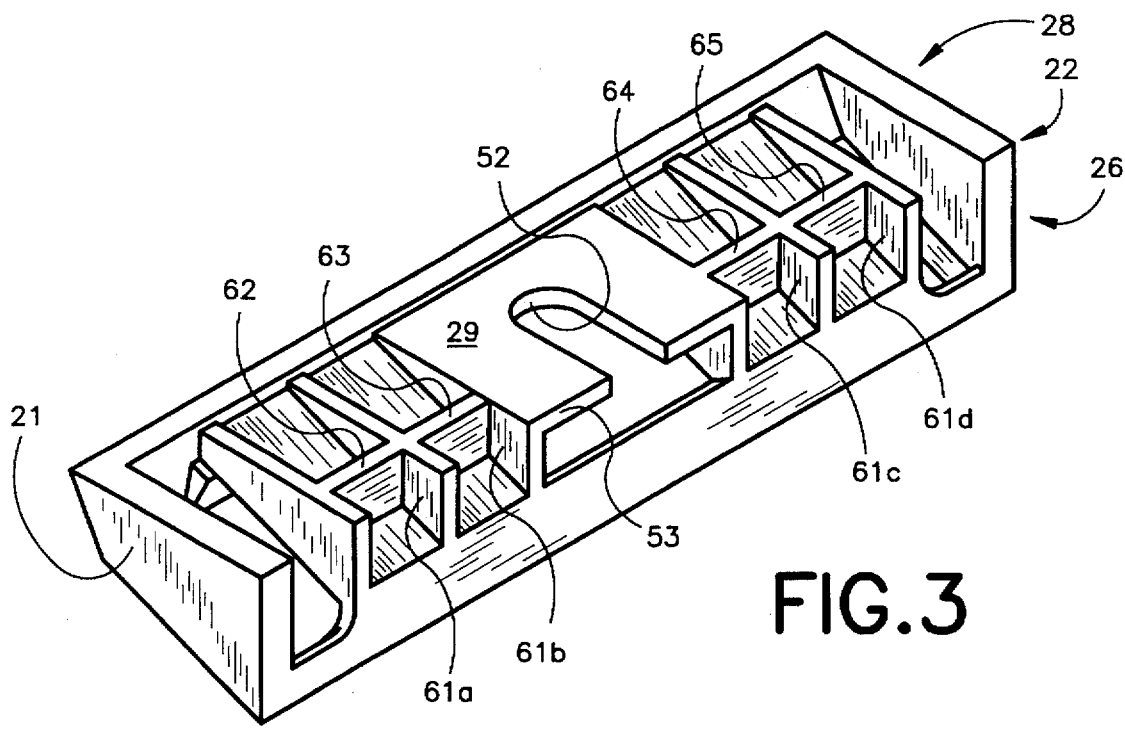
Figure 4:
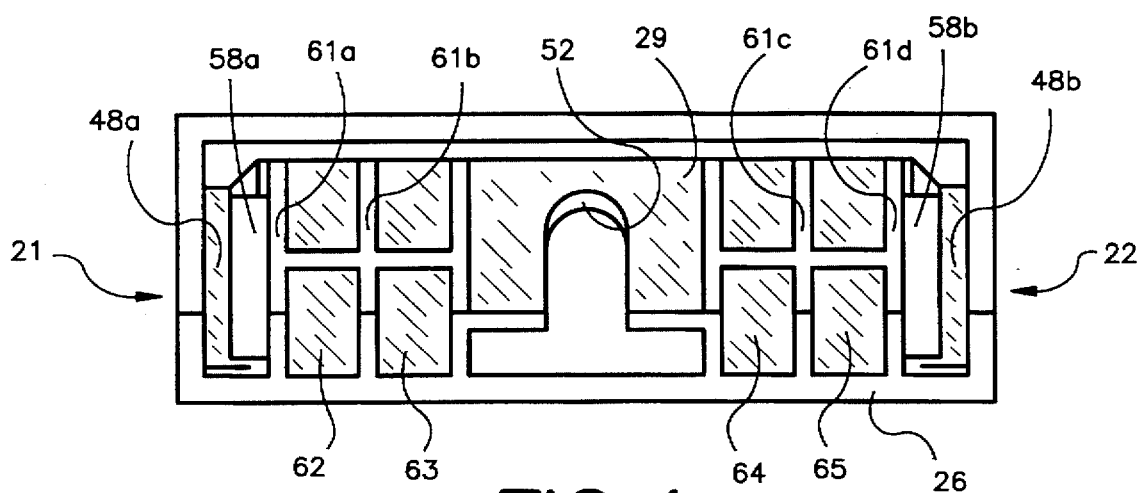
Figure 5:
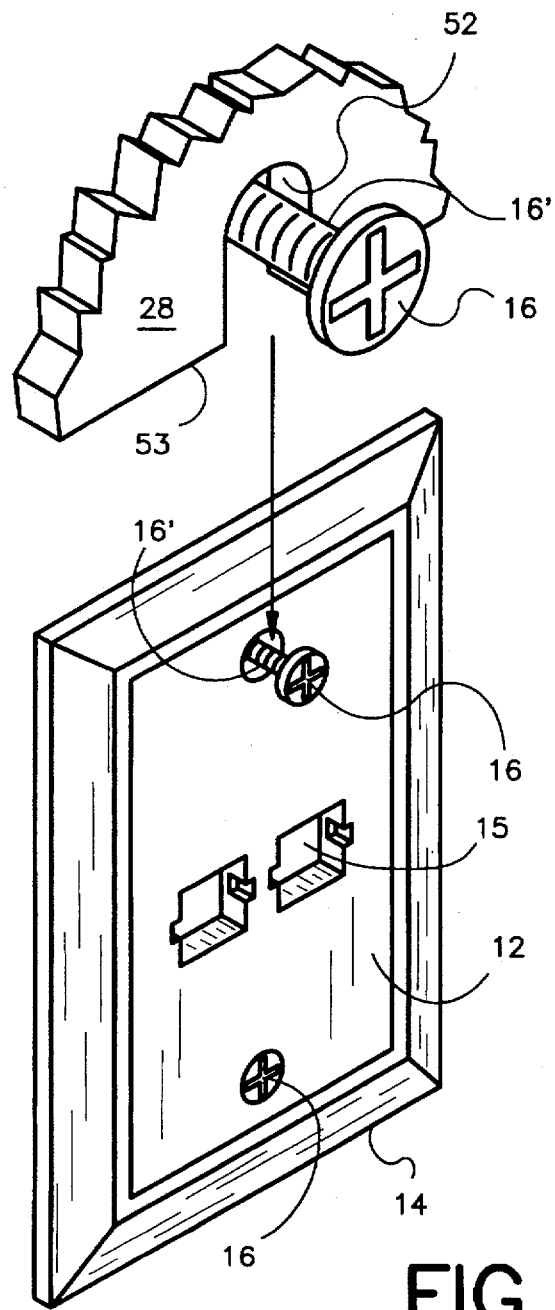
Figure 6:
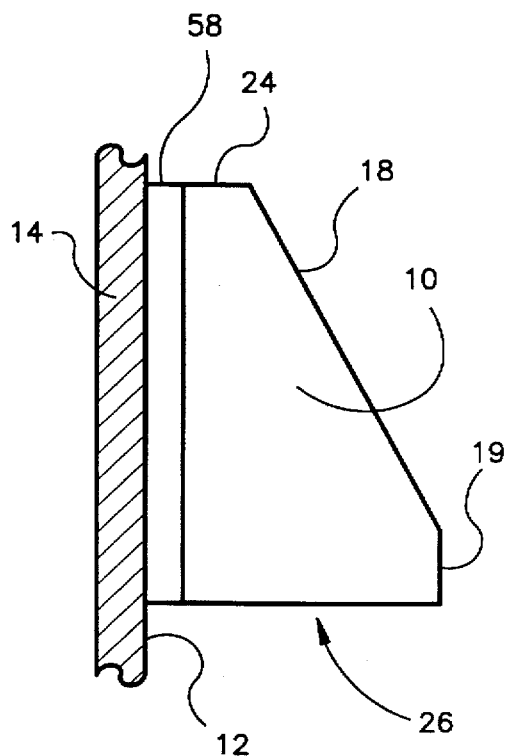
Figure 7:
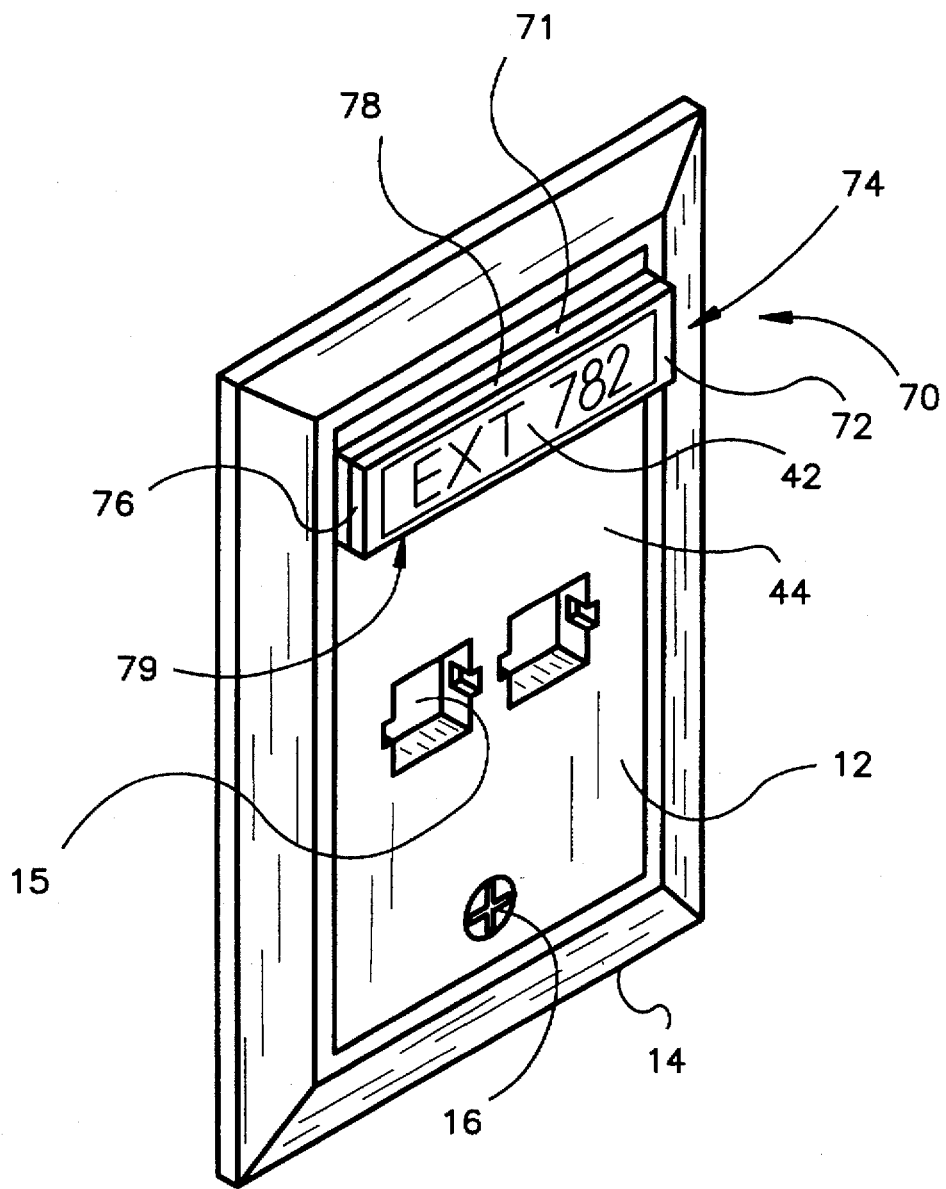
Figure 8:
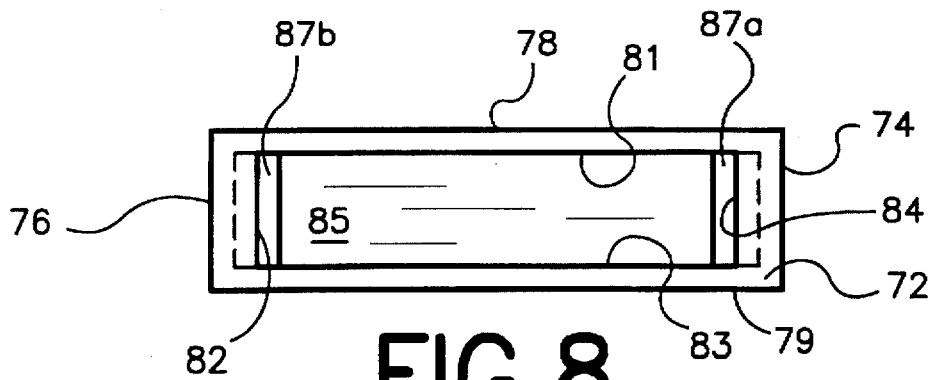
Figure 9:
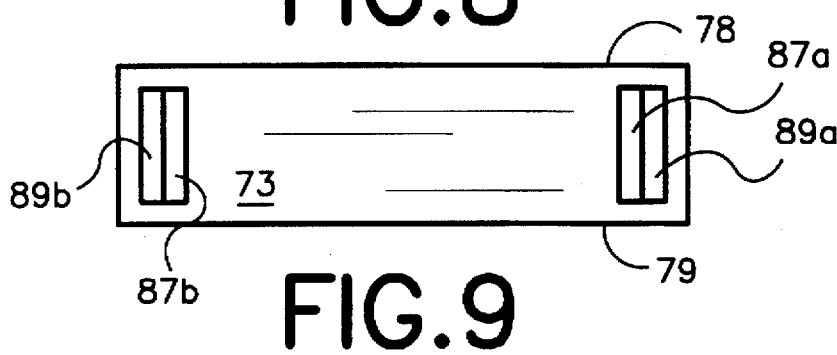

FIG. 2 is an assembly view of the first embodiment of FIG. 1;

FIG. 3 is a rear perspective view of the first embodiment of FIG. 1;

FIG. 4 is a rear and bottom view of the first embodiment of FIG. 1;

FIG. 5 is a schematic illustration showing attachment of the second embodiment of FIG. 1 to the exterior face of a wall face plate via the wall plate screw;

FIG. 6 is a side view of the first embodiment of FIG. 1A attached to a wall face plate via an adhesive tape;

FIG. 7 is a second embodiment of the information display apparatus of the invention;

FIG. 8 is a front view of the second embodiment of FIG. 7;

FIG. 9 is a rear view of the second embodiment of FIG. 7; and

Figure 10:
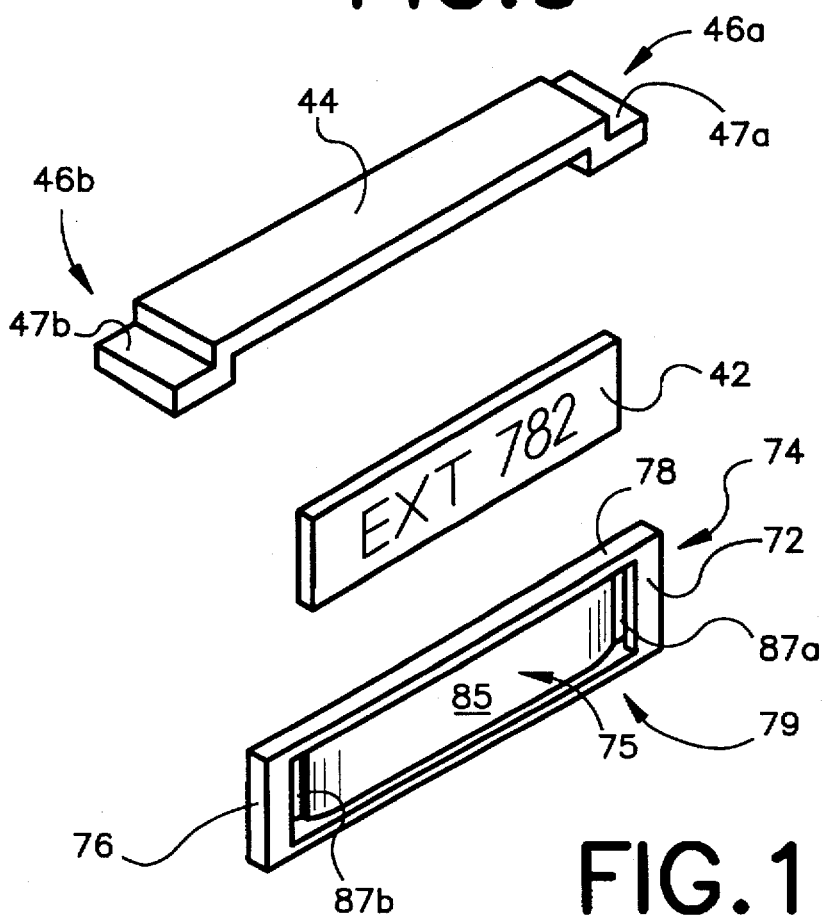

FIG. 10 is an assembly view of the second embodiment of FIG. 7.

DETAILED DESCRIPTION OF THE PREFERRED EMBODIMENT

The construction of the first embodiment of the information display apparatus of the invention is shown in FIGS. 1 through 4. As shown in FIG. 1, the information display apparatus 10 is disposed at the exterior face 12 of a wall face plate 14 that is mounted to a wall via wall face plate screws 16, typically two in number. The face plate 14 is shown as one that is used in connection with telephone jacks 15, by way of example. However, the invention can be utilized in connection with any type of face plate 14, including electrical power outlets, coaxial jacks, optical ports, etc.

In structure, the information display apparatus 10 includes an elongated housing manufactured from any suitable material, for example, a generally rigid plastic material that is colored or transparent. The housing includes an angled display face 18, opposing right and left sides 21, 22 that are disposed adjacent to the display face 18 and the front lower portion 19, a top side 24, a bottom side 26, and a rear side 28. When the information display apparatus 10 is attached to the wall face plate 14, the rear side 28 is disposed contiguous with the exterior surface 12 of the face plate 14. Moreover, the display face 18 includes a shallow rectangular cavity 32 that is defined by internal surfaces 33–36 and spaced coplanar internal information panel supports 38a, 38b. The size and shape of cavity 32 is adapted to receive a flat rectangular information panel 42 and a transparent cover 44 thereover. The transparent cover is preferably a clear semi-rigid plastic material.

The information panel cover 44 has right and left stepped configurations 46a, 46b, as shown in FIG. 2, with recessed portions 47a, 47b, which extend into respective cavities 49a, 49b within the information display apparatus 10. The portions 47a, 47b are sized to be received in channels 51a, 51b, respectively, when the cover 44 is flexed inwardly, and then when the cover 44 is deflexed, the portions 47a, 47b extend into the cavities 49a, 49b and the portions 47a, 47b contact respective internal parts 48a, 48b of the display face 18.

Preferably, an information panel 42 is interposed between the cover 44 and the supports 38a, 38b. The information panel 42 can be made from any suitable material, such as paperboard. As an example of information that can be placed on the information panel 42, FIGS. 1 and 2 shows "EXT 782" on the information panel 42 to indicate that the associated telephone jacks 15 correspond to this extension number.

4

The rear side 28 of the information display apparatus 10 is shown in FIGS. 3 and 4. As shown in FIGS. 3 and 4, the rear side 28 includes a network of supports for enhanced rigidity. In particular, the rear side 28 includes, between sides 21, 22, a plurality of column supports 61a–61d. Spanning between the column supports 61a, 61b is a row support 62. Spanning between the column supports 61b and a planar rear part 29 is a row support 63. Spanning between the rear part 29 and the column support 61c is a row support 64. Finally, spanning between the column supports 61c, 61d is a row support 65.

The rear side 28 of the information display apparatus 10 preferably includes an aperture 52 in the rear part 29. The aperture 52 extends from a bottom edge 53 of the rear side 28 inwardly to an internal area. The aperture 52 is sized to receive a screw shaft of a wall face plate screw 16. In the preferred embodiment, the aperture 52 are arch shaped. Because the aperture 52 begins at the edge 53, the screw shaft 16' can be passed into the aperture 52 without having to completely remove the screw 16 from the wall during installation and removal of the information display apparatus 10, as is best illustrated in FIG. 3.

Between the internal information panel supports 38a, 38b is an opening 55, as illustrated in FIG. 2, that is aligned with the aperture 52 and sized to receive the working end of a conventional screwdriver so that the screw 16 can be directly manipulated from the front of the information display apparatus 10.

In addition to the possibility of attaching the information display apparatus 10 to the exterior surface 12 of the face plate 14 using a face plate screw 16, the information display apparatus 10 can also be affixed to the face plate 16 with an adhesive, adhesive material, adhesive tape, or other suitable attachment mechanism. In this regard, as a further example, FIG. 4 shows the information display apparatus 10 attached to the face plate 14 with adhesive foam tape 58. This embodiment can be utilized with face plates 14 that do not have face plate screws 16. Furthermore, the information display apparatus 10 may even be affixed to a portion of the wall that resides above the face plate 14, if desired.

A second embodiment of the invention is illustrated in FIGS. 7 through 9. The information display apparatus 70 is attached to the wall face plate 14 with any suitable attachment mechanism. In the preferred embodiment, the rear part 73 of the information display apparatus 70 is attached to the exterior surface 12 of the wall face plate 14 via an adhesive foam tape 71.

The information display apparatus 70 is shaped as a generally thin elongated rectangular structure having a display face 72 that supports an information panel 44 essentially parallel to the exterior surface 12 of the face plate 14. The right and left sides 74, 76 and the top and bottom sides 78, 79 are essentially rectangular in shape, as is illustrated in FIG. 7. The display face 72 includes a shallow rectangular cavity 75 that is defined by internal surfaces 81–84 and an information panel support 85. The size and shape of cavity 75 is adapted to receive the flat rectangular information panel 42 and the transparent cover 44 thereover. The transparent cover 44 is preferably a clear semi-rigid plastic material.

The information panel cover 44 has fight and left stepped configurations 46a, 46b, as shown in FIG. 10, with recessed portions 47a, 47b, which extend into respective cavities 87a, 87b within the information display apparatus 70. The portions 47a, 47b are sized to be received in channels 87a, 87b, respectively, when the cover 44 is flexed inwardly, and then when the cover 44 is reflexed, the portions 47a, 47b extend into the cavities 87a, 87b and the portions 47a, 47b contact respective internal parts 89a, 89b of the display face 72. Preferably, an information panel 42 is interposed between the cover 44 and the support 85.

In concluding the detailed description, it should be noted that it will be obvious to those skilled in the art that many variations and modifications can be made to preferred embodiments without substantially departing from the principles of the present invention. All such variations and modifications are intended to be included herein within the scope of the present invention, as set forth in the following claims.

Wherefore, the following is claimed:

1. An apparatus for displaying information at a wall face plate, comprising:

a housing having a display face; and attachment means for permitting attachment of said housing to an exterior face of said wall face plate; and an information panel associated with said display face and externally visible, said information panel for displaying said information;

wherein said housing comprises a rear side that is placed contiguous with said exterior face of said wall face plate when said apparatus is attached to said face plate, said rear side having an aperture sized to receive a screw shaft associated with a face plate screw, said aperture extending from an edge of said rear side to an internal region to permit ingress and egress of said screw shaft therethrough.

2. The apparatus of claim 1, wherein said housing comprises a rear side with an aperture sized to receive a screw shaft associated with a face plate screw.

3. The apparatus of claim 1, wherein said display face is angled on said housing to expose said information outwardly and upwardly when said housing is attached to said face plate by said attachment means.

4. The apparatus of claim 1, wherein said housing comprises an exterior structure with a rear side placed contiguous with said exterior face of said wall face plate when said apparatus is attached to said face plate, opposing left and right sides disposed adjacent to said rear side, a bottom side disposed adjacent to said rear, left, and right sides, and said display face angled to expose said information upwardly when said housing is attached to said face plate, said display face disposed adjacent to said bottom, left, and right sides.

5. The apparatus of claim 1, wherein said housing is plastic.

6. The apparatus of claim 1, wherein said wall face plate comprises a telephone jack.

7. The apparatus of claim 1, wherein said housing has a rear side that is placed contiguous with said face plate when said apparatus is attached to said face plate, said apparatus further comprising adhesive tape disposed on said rear side.

8. The apparatus of claim 2, wherein said display face is angled, said apparatus further comprising an internal information panel support extending parallel to said angled display face and between said right and left sides, said internal information panel support having an opening substantially aligned with said aperture and said sized to receive a working end of a screw driver.

9. An arrangement for displaying information at a wall face plate, comprising:

a wall face plate with an exterior face;

a housing having a display face and a rear side that is attached to said exterior face of said wall face plate; and an information panel associated with said display face and externally visible;

wherein said rear side of said housing has an aperture sized to receive a screw shaft associated with a face plate screw, said aperture extending from an edge of said rear side to an internal region to permit ingress and egress of said screw shaft therethrough.

10. The arrangement of claim 9, further comprising an attachment means for attaching said rear side of said housing to said exterior face of said wall face plate.

11. The arrangement of claim 9, wherein said rear side of said housing comprises an aperture that receives a screw shaft associated with a face plate screw.

12. The arrangement of claim 9, wherein said display face is angled on said housing to expose said information outwardly and upwardly.

13. The arrangement of claim 9, wherein said housing is plastic.

14. The arrangement of claim 9, wherein said wall face plate comprises a telephone jack.

15. The arrangement of claim 9, further comprising adhesive tape interposed between said rear side of said housing and said exterior face of said face plate.

16. A method for displaying information at a wall face plate, comprising the steps of:

attaching a housing having a display face and a rear side to an exterior face of a wall face plate;

maintaining an information panel on said housing so that said information panel is externally visible; and providing an aperture in said rear side of said housing, said aperture sized to receive a screw shaft associated with a face plate screw, said aperture extending from an edge of said rear side to an internal region to permit ingress and egress of said screw shaft therethrough.

17. The method of claim 16, wherein said step of attaching includes the step of attaching said housing to a screw shaft of a wall face plate screw.

18. The method of claim 16, wherein said step of attaching includes the step of attaching said housing to said wall face plate via an adhesive tape.

19. The method of claim 16, wherein said step of maintaining includes the step of angling said plate outwardly and upwardly.

20. An apparatus for displaying information at a wall face plate, comprising:

a housing having a display face; and attachment means for permitting attachment of said housing to an exterior face of said wall face plate; and an information panel associated with said display face and externally visible, said information panel for displaying said information;

said housing comprises an exterior structure with a rear side placed contiguous with said exterior face of said wall face plate when said apparatus is attached to said face plate, opposing left and right sides disposed adjacent to said rear side, a bottom side disposed adjacent to said rear, left, and right sides, and said display face angled to expose said information upwardly when said housing is attached to said face plate, said display face disposed adjacent to said bottom, left, and right sides;

said rear panel comprises an aperture sized to receive a screw shaft associated with a face plate screw, said aperture extending from an edge of said rear panel to an internal region to permit ingress and egress of said screw shaft therethrough.

21. The apparatus of claim 20, wherein said housing further comprises an internal information panel support extending parallel to said angled display face and between said right and left sides, said internal information panel support having an opening substantially aligned with said aperture and said sized to receive a working end of a screw driver.

22. The apparatus of claim 20, wherein said display face of said housing comprises opposing right and left cavities situated internally adjacent to said right and left sides respectively, and wherein said housing further comprises a transparent cover plate to be placed over an exterior of an information panel, said cover plate having right and left distal ends that have respective stepped regions sized to mate with said right and left cavities.

23. An arrangement for displaying information at a wall face plate, comprising:

a wall face plate with an exterior face;

a housing having a display face and a rear side that is attached to said exterior face of said wall face plate;

an information panel associated with said display face and externally visible;

wherein said housing comprises an exterior structure with said rear side, opposing left and right sides disposed adjacent to said rear side, a bottom side disposed adjacent to said rear, left, and right sides, and said display face angled to expose said information outwardly and upwardly when said housing is attached to said face plate, said display face disposed adjacent to said bottom, left, and right sides; and wherein said rear panel comprises an aperture sized to receive a screw shaft associated with a face plate screw, said aperture extending from an edge of said rear panel to an internal region to permit ingress and egress of said screw shaft therethrough and wherein said housing further comprises an internal information panel support extending parallel to said angled display face and between said right and left sides, said internal information panel support having an opening substantially aligned with said aperture and said sized to receive a working end of a screw driver.

24. The arrangement of claim 23, wherein said display face of said housing comprises opposing right and left cavities situated internally adjacent to said right and left sides respectively, and wherein said housing further comprises a transparent cover plate to be placed over an exterior of an information panel, said cover plate having right and left distal ends that have respective stepped regions sized to mate with said right and left cavities.

* * * * *